(12) United States Patent
Engin

(10) Patent No.: US 8,438,434 B2
(45) Date of Patent: May 7, 2013

(54) N-WAY PARALLEL TURBO DECODER ARCHITECTURE

(75) Inventor: Nur Engin, Eindhoven (NL)

(73) Assignee: NXP B.V., Eindhoven (NL)

( * ) Notice: Subject to any disclaimer, the term of this patent is extended or adjusted under 35 U.S.C. 154(b) by 634 days.

(21) Appl. No.: 12/650,072

(22) Filed: Dec. 30, 2009

(65) Prior Publication Data

US 2011/0161782 A1    Jun. 30, 2011

(51) Int. Cl.
*G06F 11/00* (2006.01)

(52) U.S. Cl.
USPC .............. 714/723; 714/755; 714/756; 711/5; 711/127; 711/157

(58) Field of Classification Search ........................ None
See application file for complete search history.

(56) References Cited

U.S. PATENT DOCUMENTS

| | | | | |
|---|---|---|---|---|
| 6,574,766 | B2* | 6/2003 | Obuchi et al. ................ | 714/755 |
| 7,366,962 | B2* | 4/2008 | Tanoue ........................ | 714/702 |
| 7,610,457 | B2* | 10/2009 | Lee .............................. | 711/157 |
| 7,715,503 | B2* | 5/2010 | Cameron et al. ............. | 375/340 |
| 8,103,944 | B2* | 1/2012 | Treigherman et al. ....... | 714/784 |
| 8,225,027 | B2* | 7/2012 | Venkatramani et al. ..... | 711/5 |
| 2008/0189467 | A1* | 8/2008 | Ikeda et al. .................. | 711/5 |
| 2009/0138670 | A1* | 5/2009 | Mutlu et al. ................. | 711/167 |
| 2011/0041042 | A1* | 2/2011 | Han et al. .................... | 714/786 |

OTHER PUBLICATIONS

Wang et al, "Area-Efficient High-Speed Decoding Schemes for Turbo Decoders", IEEE Transactions on Very Large Scale Integration (VLSI) Systems, vol. 10, No. 6, Dec. 2002, pp. 902912.
Boutillon et al, "Iterative Decoding of Concatenated Convolutional Codes: Implementation Issues", Proceedings of the IEEE, vol. 95, No. 6, Jun. 2007, pp. 1201-1227.
Small World Communications, "Iterative Decoding of Parallel Concatenated Convolutional Codes," XP002922269, Jan. 1999.
Nanya Technology Corp., NT56V6620CT, 64 Mb Synchronous DRAM Data Sheet, Rev 1.1, Jun. 2000.
ETSI, "Satellite Earth Stations and Systems; Satellite Digital Radio Systems; Part 1," Jul. 2009.
Extended European Search Report for EP Application No. 10195552, European Patent Office, The Netherlands, Feb. 2011.

* cited by examiner

*Primary Examiner* — Christopher McCarthy

(57) ABSTRACT

Various embodiments relate to a memory device in a turbo decoder and a related method for allocating data into the memory device. Different communications standards use data blocks of varying sizes when enacting block decoding of concatenated convolutional codes. The memory device efficiently minimizes space while enabling a higher throughput of the turbo decoder by enabling a plurality of memory banks of equal size. The number of memory banks may be limited by the amount of unused space in the memory banks, which may be a waste of area on an IC chip. Using the address associated with the maximum value of the data block, the memory may be split into a plurality of memory blocks according to the most-significant bits of the maximum address, with a number of parallel SISO decoders matching the number of memory banks. This may enable higher throughput while minimizing area on the IC chip.

22 Claims, 4 Drawing Sheets

N-WAY PARALLEL TURBO DECODER ARCHITECTURE

TECHNICAL FIELD

Embodiments disclosed herein relate generally to convolutional codes and iterative decoders.

BACKGROUND

Turbo codes are based on parallel concatenation of two recursive systematic convolutional codes separated by an interleaves. Similar to gas in a turbo-compressed engine that is constantly recycled during operation, turbo coding algorithms uses an iterative algorithm between two decoders, constantly exchanging information between each other in order to improve error correction performance. Turbo coding is also used with concatenation of block codes. Turbo coding may be a channel coding scheme used in wireless broadcasting, communications, and networking standards. Some modern standards include, for example, CDMA2000 (Code Division Multiple Access 2000), DVB-SH (Digital Video Broadcasting-Satellite services to Handhelds), UMTS (Universal Mobile Telecommunications System), ETSI-SDR (European Telecommunications Standards Institute-Satellite Digital Radio), MediaFLO (Forward Link Only) and WiMax (Worldwide Interoperability for Microwave Access, IEEE 802.16). Turbo decoders are regularly implemented in dedicated hardware in, for example, various communications devices that receive encoded data. During regular operation, turbo decoders may become very computation-intensive and memory-intensive, both due to the memory used to store the received data sequence, and the number of iterations used to correct the received data. When operating to adhere to a specific standard (e.g., ETSI-SDR), the interleave address generation components of the turbo decoder may be implemented in dedicated hardware. When one standard needs to be supported, the interleave address generation can also be implemented in dedicated hardware. In this case, a range of block sizes need to be supported but the calculations remain largely the same. As the bit rate supported by the wireless standards increases, higher throughput turbo decoders are needed. New broadcast standards, such as DVB-SH, can require over 30 Mbps throughput for a single channel. When multiple channels are involved, the throughput can be well over 50 Mbps. Data rates higher than 100 Mbps are expected to be use in the near future. Efforts to achieve the constantly increasing throughput demands may require, for example, prohibitively high clock rates or separate, dedicated, fast clocks for the turbo decoder. Either implementation, however, may bring disadvantages, such as, for example, problems in the system-on-chip design for broadcast reception.

Turbo decoders are discussed by Wang, et al. in "Area-Efficient High-Speed Decoding Schemes for Turbo Decoders", IEEE Transactions on VLSI Systems, vol. 10, no. 6 (December 2002) and by Boutillon, et al. in "Iterative Decoding of Concatenated Convolutional Codes: Implementation Issues", Proceedings of the IEEE, vol. 95, no. 6 (June 2007).

Some implementations of the turbo decoder may use a number of parallel soft-in soft-out (SISO) decoders to process more data sequences simultaneously, thus creating a higher throughput without increasing the clock speed. However, the architecture of a turbo decoder may be heavily affected by the interleaver design specified in the communications standard. Some communications standards (such as UMTS LTE) may allow parallel processing much more readily than other standards, where, for example, the interleaving algorithm does not scale linearly, in which case design modifications are needed to assure parallel operation.

The turbo interleaver specified in the DVB-SH and ETSI-SDR standards is essentially not a parallel interleaver, meaning the turbo decoder will be implemented with a single SISO unit, limiting the throughput of the turbo decoder with the clock speed it runs at (e.g. for 200 MHz clock speed, less than 15 Mbps). However, higher throughputs are often required. This can be achieved by including multiple turbo decoders in the system, but that disadvantageously increases (e.g. doubles, triples) the silicon area needed for the turbo decoder.

In view of the foregoing, it would be desirable to implement a turbo decoder implementing parallel processing for a plurality of different communications standards that do not enable parallel processing.

SUMMARY

The present embodiments provide, among other features and benefits, a turbo decoder architecture for a plurality of communications standards using N-way parallelism. A brief summary of various exemplary embodiments is presented. Some simplifications and omissions may be made in the following summary, which is intended to highlight and introduce some aspects of the various exemplary embodiments, but not to limit the scope of the invention. Detailed descriptions of a preferred exemplary embodiment adequate to allow those of ordinary skill in the art to make and use the inventive concepts will follow in later sections.

This invention involves turbo decoder architecture optimal for use with DVB-SH and ETSI standards (but is not necessarily limited thereto). One aspect of this invention is N-way parallelism (the turbo interleaves described in the standard does not readily enable parallelism).

A turbo decoder architecture can be employed that adapts the memories and processing within the turbo decoder to enable faster operation at smaller area cost compared to known turbo decoder designs.

The invention's architecture enables parallelism through a special memory mapping and hold option in SISO's. This way it is possible to build a turbo decoder reaching throughputs up to approximately 100 Mbps at a clock speed of approximately 200 MHz. Since the throughput does not only depend on the clock rate, the turbo clock can be operated at the system clock rate instead of requiring a special faster clock.

Further, this invention involves a turbo decoder architecture that adapts the memories and processing within the turbo decoder for enabling faster operation at lower area cost compared to known turbo decoder designs.

Various embodiments may relate to a memory unit to store data from a data block of predefined size, the memory unit comprising a plurality of memory banks comprising an equal number of spaces wherein a minimum number of spaces remains unoccupied when all bits in the data block occupy separate spaces in the plurality of memory banks, configured to: upon a request to write into at least one of the memory banks in the plurality, store data associated with a received address, the received address comprising an address field and a sub-address field, wherein the address field contains a value corresponding to a target memory bank in the plurality of memory banks and the sub-address field contains a value corresponding to a target space within the target memory bank, wherein the size of the data block is defined by one of a group of standards: MediaFLO, ETSI-SDR, or DVB-SH.

Various embodiments may also relate to a turbo decoder for decoding a received data sequence, the turbo decoder comprising a plurality of soft-in soft-out (SISO) decoders to simultaneously decode a plurality of components of the received data sequence and produce a decoded data sequence and an interleaver to generate addresses for sequential bits comprising the decoded data sequence, the interleaver comprising an address generation unit to generate a first sequential series of initial addresses to associate with the sequential bits comprising the decoded data sequence, an interleaved address generation unit to generate a second sequential series of interleaved addresses to associate with the sequential bits comprising the decoded data, wherein the interleaved address associated with a bit in the decoded data sequence is not equal to the initial addresses, and a first memory unit to receive and store the data according to the associated interleaved address and a second memory unit to receive and store the decoded data sequence according to the initial address, at least one memory unit comprising: a plurality of memory banks comprising an equal number of spaces, wherein a minimum number of spaces remains unoccupied when all bits in the data block occupy separate spaces in the plurality of memory banks, to store data associated with a received address, the received address comprising an address field and a sub-address field, wherein the address field contains a value corresponding to a target memory bank in the plurality of memory banks and the sub-address contains a value corresponding to a target space within the target memory bank, wherein the size of the data block is defined by one of a group of standards: MediaFLO, ETSI-SDR, or DVB-SH.

Various embodiments may also relate to a method of storing data from a data block of predefined size into memory, the method comprising: receiving the data with a received address, the received address comprising an address field and a sub-address field, matching the address field value with a corresponding target memory bank in a plurality of memory banks comprising an equal number of spaces to store data associated with a received address, wherein a minimum number of spaces remains unoccupied when all bits in the data block occupy separate series in the plurality of memory banks, the number of memory banks in the plurality of memory banks corresponding to the address field value of a maximum address of the data block so that a minimum number of spaces remains unoccupied when all bits in the data block occupy separate spaces in the plurality of memory banks, matching the sub-address field value to a corresponding target space within the target memory bank, and storing the data in the target space within the target memory bank, wherein the size of the data block is defined by one of a group of standards: MediaFLO, ETSI-SDR, or DVB-SH.

It should be apparent that, in this manner, various exemplary embodiments enable a turbo decoder using N-way parallelism through special memory mapping. Other embodiments also enable hold options in the SISO algorithm in the case of writing conflicts. This may enable the implementation of a turbo decoder reaching throughputs of up to 100 Mbps at clock speeds of 200 MHz, while minimizing the area used to create a plurality of memory banks. The exemplary embodiments enable a parallel turbo decoder that may also be operated at a regular system clock rate in lieu of a dedicated, faster clock, which may therefore cost less manufacture and may be simpler to implement.

BRIEF DESCRIPTION OF THE DRAWINGS

In order to facilitate better understanding of various exemplary embodiments, reference is made to the accompanying drawings, wherein.

DETAILED DESCRIPTION

Figure 1:
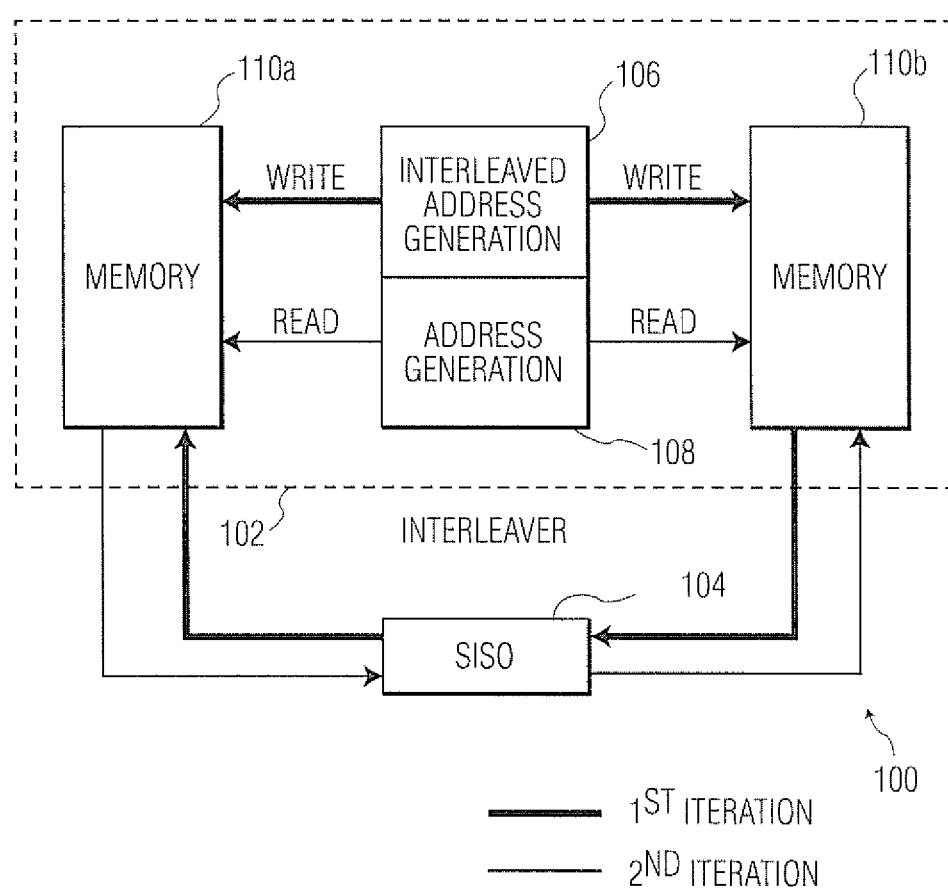
FIG. 1 is a block diagram of an exemplary turbo decoder.

Referring now to the drawings, in which like numerals refer to like components or steps, there are disclosed broad aspects of various exemplary embodiments.

FIG. 1 is an illustration of an exemplary turbo decoder. The turbo decoder 100 consists of a plurality of operationally-connected components, including a Soft-Input, Soft-Output (SISO) decoder 104 and an interleaves 102 consisting of an interleaved address generation unit 106, an address generation unit 108, and a plurality of memory units 110a-b.

Speaking generally, the SISO decoder 104 decodes a data frame and corrects a few errors. The frame is interleaved and decoded again. This way, more errors are corrected each time. These iterations can be repeated for a predefined number of times or until no more errors are corrected. Interleaving algorithms may be specified in the communication standards and may be designed to shuffle data in a pseudo-random manner.

More specifically, during regular operation, the turbo decoder 100 may decode incoming data sequences in a series of iterations. The data sequences may be comprised of a pair of component codes. During a single iteration, the SISO decoder 104 may decode either linearly-ordered symbols or interleaved symbols. During the subsequent iteration, the turbo decoder may reverse direction and decode symbols in the other order. For example, during an even iteration, the SISO decoder 104 may read from to memory unit 110a and output into the memory unit 110b in a linear order. During an odd iteration, the SISO decoder 104 may read from the memory unit 110b and output into memory unit 110a in an interleaved order.

The SISO decoder 104 may decode, for example, the first component code using both channel data and a priori information, both of which may have been stored in the memory unit 110a during a previous iteration as inputs. After decoding, the SISO decoder 102 may then store the extrinsic information into memory unit 110a. This extrinsic information may be used in subsequent iterations as a priori information when, for example, the second component code is processed. The SISO decoder 104 may then store the decoded data into the memory unit 110b, which may be used as channel data in a subsequent iteration. When a predefined number of iterations is reached or when convergence is detected, the iterations within the turbo decoder 100 are stopped and the output bits from the initial data sequence are obtained.

The soft-in soft-out (SISO) decoder 104 may decode a data sequence, which may consequently correct errors during a single iteration. The SISO decoder 104 may receive a data sequence and may allow "soft" values to be received from the data sequence. Soft values may be defined as bits other than a logical "1" or "0". The SISO decoder 104 may allow values other than a logical "1" or "0" in order to capture more specific values. The SISO decoder 104 may also output a "soft" output value that indicates a reliability level for each bit in the decoded output. The output of the SISO decoder 104 may be in the form of a decoded data sequence. The SISO decoder may also output extrinsic information, which may be a soft output and may later be used as the soft input for the SISO decoder 104 during a subsequent iteration.

During regular operation, the decoded data sequence outputted from SISO decoder 104 may be rearranged by the interleaver 102 and decoded again by SISO decoder 104. While the interleaving protects against bulk errors, the iterative decoding by the SISO decoder 104 may correct more errors in the data sequence. Successive iterations of the interleaver 102 and the SISO decoder 104 may be repeated for a predefined number of iterations, or may be repeated until the SISO decoder 104 corrects no more errors. In some embodiments, the iterative decoding by the SISO decoder 104 may only work when the bits of the received data sequence are interleaved. The interleaving algorithm used by the turbo interleaver 102 may be specified in the communications standard. The interleaving algorithm may shuffle data in a pseudo-random manner, as certain interleaving algorithms may still exhibit non-random properties, such as periodicity.

The interleaver 102 rearranges bits from a received data sequence in a non-contiguous manner, which may increase performance. The interleaver 102 may boost performance by protecting a data sequence against burst errors. A burst error may overwrite a long, contiguous series of data. Other error correction schemes may not be able to prevent or recover data from burst errors due to properties that require, for example, regularity to errors or a relative dearth of errors in a specific sub-sequence. By rearranging the data sequence, a burst error may overwrite data in a more uniform manner, as when arranged in the proper order, the burst error may be spread more evenly throughout the entire sequence, thus making recovery easier. The interleaver 102 may permute a data sequence of w bits as a one-to-one function. The data may then be stored in memory units 110a-b. During an iteration, the SISO decoder 104 may read from one memory unit 110a,b and store the decoded data into the opposite memory unit 110b,a. Depending on the iteration, the data may be stored either in linear or interleaved order during the SISO decoder 104 access to the opposite memory unit 110O.

The interleaver 102 contains the interleaved address generation unit 106, address generation unit 108, and memory units 110a-b. The address generation unit 108 may generate a sequence of consecutive addresses for each bit in the sequence of w symbols. For a given data block, a data sequence may have sequential addresses up to the last bit in the sequence, whose associated address is the maximum address. For example, with a data block of size 762, the last bit in the sequence may have an assigned address equal to addr (max)=1011111010.

The interleaved address generation unit 106 may use a pre-defined interleaving algorithm to map new addresses for the sequence of w bits. The interleaved address generation unit 106 may start by first separating a least-significant bit (LSB) portion and most-significant bit (MSB) portion of the address of length w. The interleaved address generation unit 106 may conduct a bit reversal on the least significant bit portion. After a series of other permutations, the portions may be combined again to create a new address. For example, the five least-significant bits of the address 1011111010, 11010 may first be bit-reversed to 01011, which may then act as the five most-significant bits of the subsequent interleaved address.

Memory units 110a-b may store various data. Such data may include decoded data sequences by the SISO decoder 104. The SISO decoder 104 may store data in memory unit 110a,b using either addresses generated by the address generator 108 or interleaved addresses generated by the interleaved address generator 106. During an single iteration (e.g., an even iteration), the SISO decoder 104 may data from one memory unit 110a stored in an interleaved order, while storing a decoded data sequence into the opposite memory unit in a linear order. Consequently, the address generation unit 108 and interleaved address generation unit 106 may generate read and write addresses for data in the memory units 110a,b.

Figure 2:
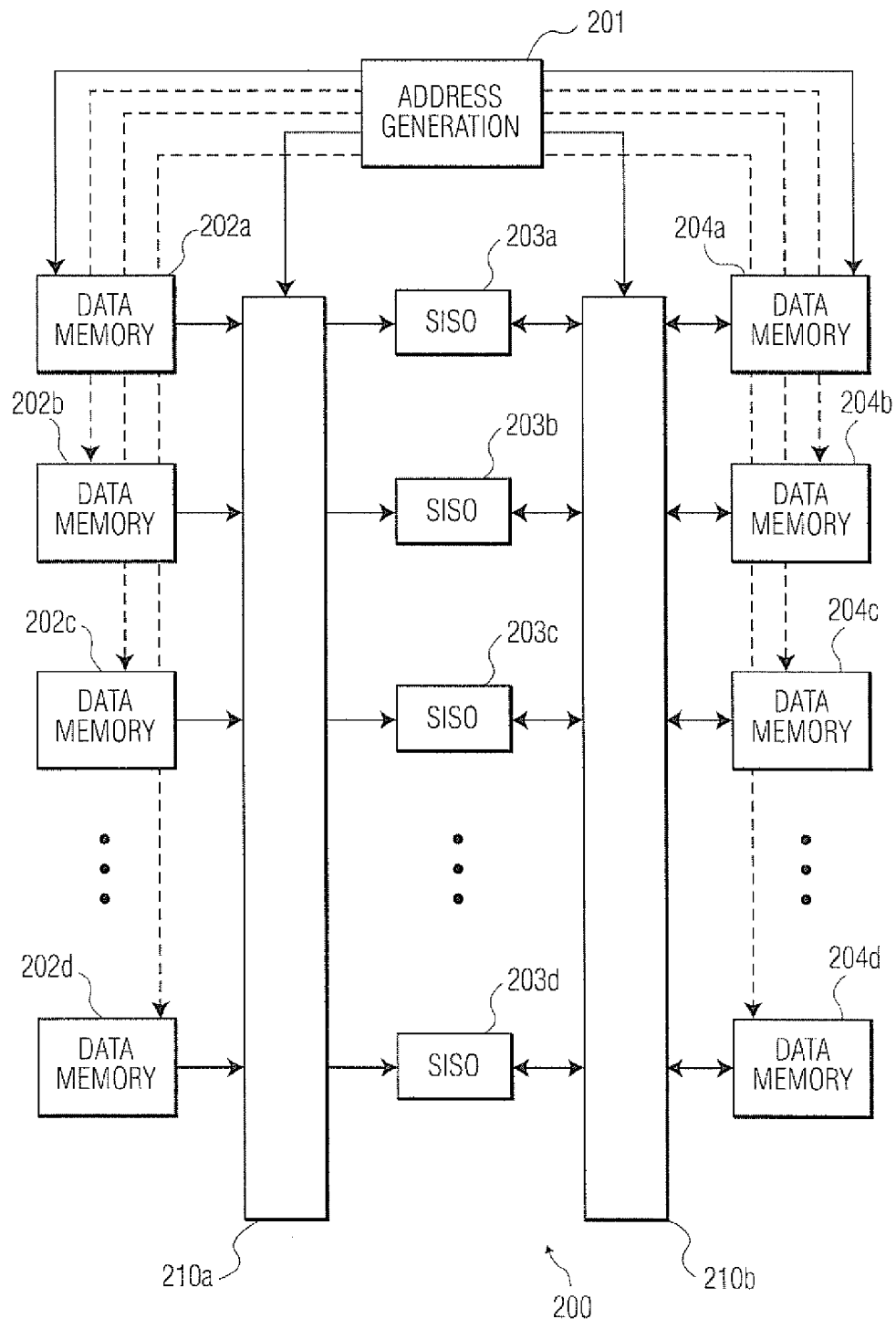
FIG. 2 is a block diagram of an exemplary parallel turbo decoder using parallel SISO decoders.

Referring now to FIG. 2, a turbo decoder containing parallel SISO decoders is illustrated. In the illustrated embodiment, the turbo decoder 200 is a parallel turbo decoder, which includes multiple convolutional processors in the form of parallel SISO decoders 203a-d that work on individual data sequences simultaneously. The interleaver 102 (partially shown) of the turbo decoder 200 now shows an address generation unit 201, which is similar in function to the address generation unit 108, a first series of data memory units 202a-d, and an opposite, second series of data memory units 204a-d, both of which are similar in function to the memory units 110a-b. The SISO decoders 203a-d may transfer data with the series of data memory units 202a-d, 204a-d through a plurality of multiplexers 210a-b.

Though the parallel turbo decoder 200 has a similar function to the single turbo decoder 100, there are differences that may cause problems when scaling the turbo decoders for multiple SISO decoders 203a-d. While during the even turbo iterations, the SISO decoders 108 process codes linearly and can be scaled with the addition of multiple SISO decoders 203a-d, the interleaved address generator 106 used during the odd turbo iterations does not scale linearly. In order to save space on the IC chip, this may result in a design decision to only add SISO decoders 203a-d, as these additions may reap the most benefit. Because the multiple SISO decoders 203a-d decode individual frames simultaneously, the SISO decoders 203a-d may therefore need to access to the extrinsic information at the same time. This may result in, for example SISO decoders 203a-d accessing data memory units 202a-d simultaneously. However, the single address generation unit 201 must therefore supply addresses for the multiple SISO decoders 203a-d to access simultaneously. As an example, when parallel turbo decoder 200 includes a quantity of N SISO decoders 203a-d, the connected address generation unit 201 in the interleaves may therefore need to generate N addresses during each clock cycle.

Each sequence that comprises a total block of data may include a plurality of addresses that may be defined as sub-sequences. Each sub-sequence may have w elements and therefore have a sub-sequence length of w. The relationship between the total block size and the number of processors may be summarized by the equation:

$$k = w \cdot N$$

Where k is the total block size, N is the number of processors (i.e., SISO decoders 203a-d), and w is the sub-sequence length.

If the entire interleaver sequence is $\pi(0)\pi(1)\pi(2)\pi(3)\pi(4)\ldots\pi(k-2)\pi(k-1)$, the parallel interleaver has to generate, in parallel, the following sub-sequences:

$$\pi(0)\pi(1)\pi(2)\ldots\pi(w-2)\pi(w-1)$$

$$\pi(w)\pi(w+1)\pi(w+2)\ldots\pi(2 \cdot w-2)\pi(2 \cdot w-1)$$

$$\ldots$$

$$\pi((N-1)\cdot w)\pi((N-1)\cdot w+1)\pi((N-1)\cdot w+2)\ldots\pi(N\cdot w-2)\pi(N\cdot w-1)$$

Thus, for a total block size that may remain constant as defined by a communications standard, an increase in the number of parallel SISO decoders 203a-d may shorten the sub-sequence length, which may shorten the processing time for each SISO decoder 203a-d. The shorter decoding time may therefore raise the throughput of the turbo decoder.

In order to organize the decoded sequences produced by parallel SISO decoders 203a-d and the addresses generated by the address generation unit 201, the turbo decoder 200 may organize the memory units 110a-b into a plurality of memory banks 202a-d, 204a-d. The SISO decoders 203a-d in parallel turbo decoder 200 may therefore access memory in parallel.

Figures 3, 4:
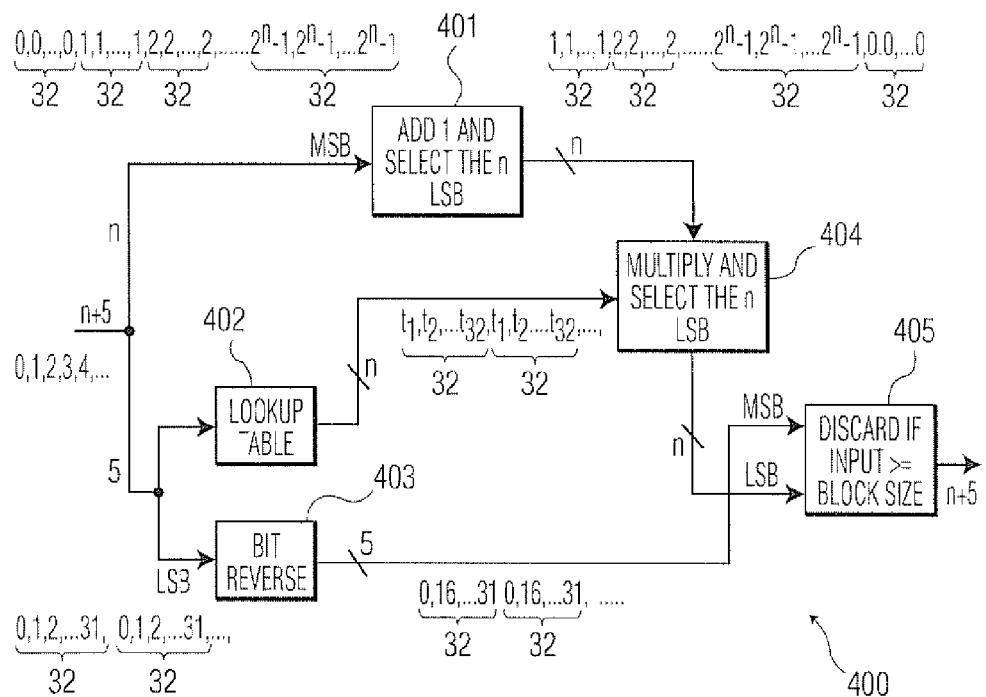
FIG. 3 is an exemplary table of values for a plurality of communications standards.
FIG. 4 is a flow chart of the interleaved address generation.

Referring now to FIG. 3, a table for generating memory banks in the parallel turbo decoder 200 is illustrated. The table 300 shows the applicable communications standard 301, the total block size 303, the maximum address value (addr(max)) 305, the address field x 307, the deciding address field y 308, the sub-address field z 309, and the number of memory banks 310. For a given standard 301, a pre-defined block size 303 may be assigned. For a given block size 303, the maximum address 305 may correspond to the address of the last bit. For example, the MediaFlo standard has a block size of 994. As a result, the last bit may be assigned the maximum address, which is 1111100010.

When expressed in binary form, the addresses comprising address field x, deciding address field y, and sub-address field z that generated by the address generation unit 201 may possess a periodicity. In the illustrated embodiment of FIG. 4, the address may comprise c+5 bits, where c∈{5,6,9}, which may be dependent upon the block size. For example, a block size of 994 may have c=5, with an address 10 bits long, while a block size of 12282 may have a c=9, with an address 14 bits long. Consequently, the separation of a total data block into a series of memory banks in the form of the data memory units 202a-d, 204a-d may be based on the observation that the most-significant bits (MSB) of any address generated by address generation unit 201 may have a periodicity equal to 32. In FIG. 4, the method 400 illustrates the interleaved address generation implemented by interleaved address generation unit 106. As shown at steps 401, 403, and 404, the input address has a periodicity of 32. The period of 32 may be derived from the five most-significant bits of the input address, whose maximum value (10111) being at least 32. The size of the memory banks may therefore follow directly from the total block sizes.

Figure 5:
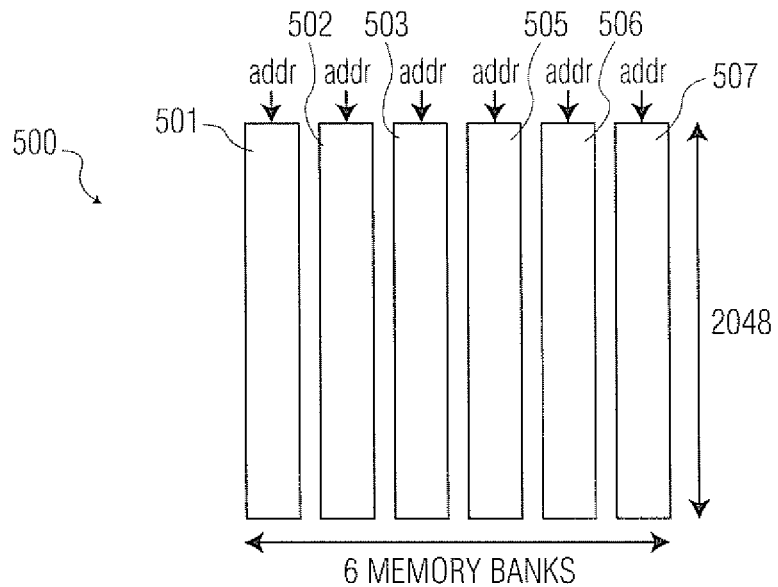
FIG. 5 is a block diagram of the plurality of exemplary memory banks.

Referring now to FIG. 5, a memory unit 500 containing multiple memory banks 501-507 is illustrated. When a parallel turbo decoder 200 uses multiple SISO decoders 203a-d, the largest block sizes may belong to the fastest modes. For example, under the ETSI-SDR standard, the block size in the turbo decoder 200 may be 12282. As indicated by the three significant bits (101) of the maximum address of 10111111111010, the memory may therefore be most efficiently divided into six banks. When splitting the memory space into six memory banks 501-507 of 2048 bits, 12288 sub-blocks may be formed in the memory. As a result, only five words in the final memory bank 507 may be left unused. Turbo decoder 200 may therefore use six parallel SISO decoders 203 simultaneously with little chance of conflict, as there may be a one-to-one relationship between memory banks 404a-f and parallel SISO decoders 203 so that no two parallel SISO decoders 203a-b attempt to write to the same memory bank 404a simultaneously. In some embodiments, multiple SISO decoders 203a-b may attempt to write to the same memory bank 404a simultaneously. In this instance, a control unit may then use a stall signal to stall one of the writes one clock cycle so that the other may be saved in the memory bank 404a during that clock cycle.

In this example, the entire address of a given data sequence may be split into an address field x and a sub-address field z. For the ETSI-SDR standard, the maximum address value may be 10111111111010. Interleaver 200 may therefore use the three most significant bits to form the address field, x=addr(13-11), which may assign an address and the associated data to a target memory bank associated with the value of the address field. Consequently, the sub-address field may be assigned the rest of the address bits, y=addr(10-0), which may be used to assign the address and the associated data a place in the target memory bank. For example, an address of 010111000111100 may be split into address field x=010 and sub-address field z=111000111100. The address field value "010" may therefore assign the associated data into third memory bank 404e, while the sub-address field value may allocate a specific space within the third memory bank 404c to store the data associated with the address.

While using the most significant digits may be efficient for a number of block sizes, simply using the three most-significant bits may not be as efficient for all data block sizes. For example, in the case of the DVB-SH standard, an 1146 block size may be used. The three most-significant bits, 100 may indicate that the memory should be divided into five memory banks. However, the maximum value for the address for the 1146 data block is 10001111010. As the fourth most-significant bit is a "0", this may indicate that not all the memory banks will be efficiently filled. In contrast with the ETSI-SDR standard that almost entirely uses the sixth memory bank, a fifth memory bank with a 1146 block size may only be filled partially, with less than half of the fifth memory bank being filled.

The interleaver 200, faced with the inefficient splitting of memory, may therefore be better off splitting the memory into only four memory banks. In some embodiments, the memory unit 400 may still be split into six memory banks: however, only four memory banks may store data: the other memory banks may not receive data and extraneous SISO decoders 203 may be gated closed in order to reduce power consumption. When using four memory banks, the interleaves 200 may split an address into three partitions, address field x=addr(10-8), deciding address field y=addr(6-5), and sub-address field z=addr(4-0). Generally, the address may be evenly split among the four memory banks using both the x and y values:

Memory Bank 0: if x==000 OR x==100 && y==00;
Memory Bank 1: if x==001 OR x==100 && y==01;
Memory Bank 2: if x==010 OR x==100 && y==10;
Memory Bank 3: if x==011 OR x==100 && y==11.

In the case that x=100, the address within the target memory bank may be converted so that the address is the sum of =100000000+z; otherwise, the address used with the assigned memory bank is addr(7-0).

When splitting the memory into four memory banks for the 1146 data block size, the control unit 402 may divide the memory into four memory banks of 288 words, thus making a total of 1152 spaces in which to store data. Interleaver 200 may therefore fill all the spaces in each of the four memory banks, save for the fourth memory bank, which may be occupied completely except for five spaces.

In another example, the ETSI-SDR standard for the signaling channel may be used, which uses a block size of 762. While the maximum address value is 1011111010, the expected address field x may be 101, with a sub-address field z of 1111010. However, for this standard, parallelism is not expected, as the 762 block size is mainly used for signaling and does not require significant upgrades in throughput. The memory unit for the ETSI-SDR may still be divided, for example, into five memory banks, even if the added area associated with the multiple SISO decoders 203*a-d* and memory banks 404*a-d* may do not result in an appreciable increase in throughput. When operating with 762 block size from only one memory bank, the remaining banks can be switched off to save power.

The MediaFlow standard may use a block size of 994. In this case, the maximum address may be 1111 1100001. Therefore, the interleaver 200 may divide the memory into four memory banks. In this instance, the address may divided into two parts: address field x=addr(10-9) and sub-address field z=addr(8-0), as the maximum value for the address 1111 1100010 signifies that the interleaver 200 may assign a value 00, 01, 10, and 11 to the four respective memory banks 404*a-d*. The interleaver 200 may use the address field value of an address to select a corresponding memory bank 404*a-d*, while using the sub-address field z value to assign the data to an address within the memory bank 404*a-d*. Each of the four memory banks 404*a-d* may therefore be composed of 256 places each, with the entire memory storing 1024 spaces. The memory may therefore be entirely used, save for 30 spaces in the fourth memory bank 404*d*.

Figure 6:
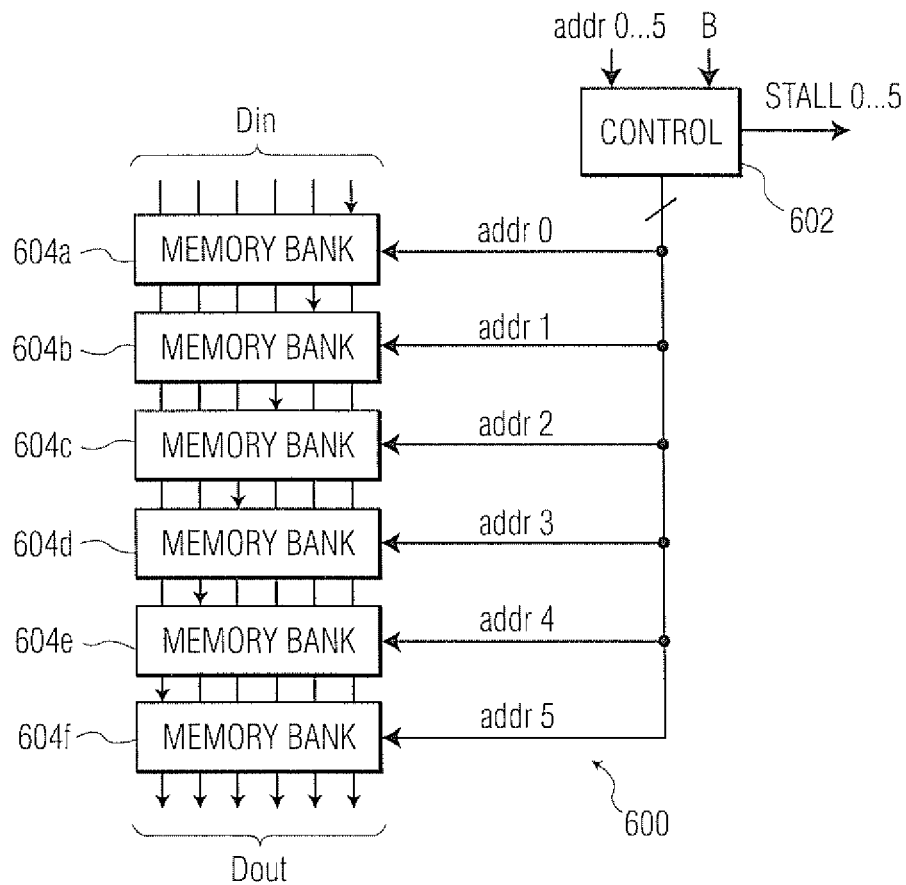
FIG. 6 is a block diagram of an exemplary memory unit in a parallel turbo decoder.

Referring now to FIG. 6, an exemplary memory unit with multiple memory banks is illustrated. A parallel turbo decoder like the turbo decoder 200 in FIG. 2 may include a memory unit 600 containing multiple banks. The memory unit 600 may contain a control unit 602 and multiple memory banks 604*a-f*. As will be discussed below, the control unit 602 may generate a stall signal during conflicts. From outside the memory unit 600, the memory unit 600 may be visible as a memory with parallelism, while the stall signals denoting that the value cannot be read or written.

Though the efficient splitting of memory into approximately-equal memory banks 604*a-f* may greatly reduce the occurrence of conflicts in the interleaves 200 when writing to the memory unit 600, some conflicts between requests to write into the memory unit 600 may still occur. When a memory conflict occurs, the corresponding SISO decoder 202*a-e* in the parallel turbo decoder 200 may be stalled. In another embodiment, the control unit 602 may stall both SISO decoders 202*a,b* that created the conflict, or all the SISO decoders 202*a-e* in the turbo decoder 200. A control signal may therefore be provided from the control unit 603 when two or more memory bank values are equal, which may signify simultaneous requests to write to the same memory bank 604*a-d*. The unit may resume operation during the next clock cycle, which may be when the conflict is resolved.

The architecture described herein is an IP block meant for use in the physical layer processing for broadcast reception, when conventional architecture is not sufficient for supporting the throughput. Up to a sixfold speedup can be achieved with negligible area cost and with low clock speed. Power savings can be enabled through the possibility of switching off part of the memory when operating at lower clock speeds.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications may be implemented while remaining within the spirit and scope of the invention. Accordingly, the foregoing disclosure, description, and figures are for illustrative purposes only and do not in any way limit the invention, which is defined only by the claims.

What is claimed is:

1. A memory unit to store data from a data block of predefined size, the memory unit comprising:
    a plurality of memory banks comprising an equal number of spaces wherein a minimum number of spaces, which is greater than zero, remains unoccupied when all bits in the data block occupy separate spaces in the plurality of memory banks, the plurality of memory banks being arranged and configured to:
    upon a request to write into at least one of the memory banks in the plurality, store data associated with a received address, the received address comprising an address field and a sub-address field, wherein the address field contains a value corresponding to a target memory bank in the plurality of memory banks and the sub-address field contains a value corresponding to a target space within the target memory bank;
    wherein the size of the data block is defined by one of a group of standards: MediaFLO, ETSI-SDR, or DVB-SH.

2. The memory unit of claim 1, further comprising:
    a control unit to produce a stall signal when the memory unit receives multiple requests to write to the target memory bank simultaneously.

3. The memory unit of claim 2, wherein the stall signal halts at least one of the multiple requests write to memory for one clock cycle.

4. The memory unit of claim 3, wherein the memory unit uses a system clock to determine a clock cycle, the memory unit sharing the system clock with other units.

5. The memory unit of claim 1, wherein the data block contains a sequential series of bits and a maximum address corresponds to a sequential address for the last bit in the data block series.

6. The memory unit of claim 1, wherein:
    the size of the data block is defined as 994,
    the address field comprises the two most-significant bits of the received address,
    the sub-address field comprises the eight least-significant bits of the received address, and
    the plurality of memory banks includes four memory banks.

7. The memory unit of claim 1, wherein:
    the size of the data block is defined as 12282,
    the address field comprises the three most-significant bits of the received address,
    the sub-address field comprises the eight least-significant bits of the received address, and
    the plurality of memory banks includes six memory banks.

8. The memory unit of claim 1, wherein:
    the size of the data block is defined as 1146,
    the address field comprises the three most-significant bits of the received address,
    the received address further comprises a deciding address field comprising the fourth and fifth most-significant bits of the received address,
    the sub-address field comprises the five least-significant bits of the received address, and
    the combination of values of the address field and the deciding address field correspond to the target memory bank in the plurality of memory banks.

9. A turbo decoder for decoding a received data sequence, the turbo decoder comprising:
    a plurality of soft-in soft-out (SISO) decoders to simultaneously decode a plurality of components of the received data sequence and produce a decoded data sequence; and an interleaver to generate addresses for sequential bits comprising the decoded data sequence, the interleaver comprising:
  an address generation unit to generate a first sequential series of initial addresses to associate with the sequential bits comprising the decoded data sequence,
  an interleaved address generation unit to generate a second sequential series of interleaved addresses to associate with the sequential bits comprising the decoded data, wherein the interleaved address associated with a bit in the decoded data sequence is not equal to the initial addresses, and
  a first memory unit to receive and store the data according to the associated interleaved address and a second memory unit to receive and store the decoded data sequence according to the initial address, at least one of the first and second memory units comprising:
    a plurality of memory banks comprising an equal number of spaces, wherein a minimum number of spaces, which is greater than zero, remains unoccupied when all bits in the data block occupy separate spaces in the plurality of memory banks, to store data associated with a received address, the received address comprising an address field and a sub-address field, wherein the address field contains a value corresponding to a target memory bank in the plurality of memory banks and the sub-address field contains a value corresponding to a target space within the target memory bank;
    wherein the size of the data block is defined by one of a group of standards: MediaFLO, ETSI-SDR, or DVB-SH.

10. The turbo decoder of claim 9, wherein the memory unit further comprises:
  a control unit to produce a stall signal when the memory unit receives multiple requests to write to the target memory bank simultaneously.

11. The turbo decoder of claim 10, wherein the stall signal halts at least one of the multiple requests write to memory for one clock cycle.

12. The memory unit of claim 11, wherein the turbo decoder uses a system clock to determine a clock cycle, the memory unit sharing the system clock with other units.

13. The turbo decoder of claim 9, wherein a maximum address corresponds to a sequential address for the last bit in the data block.

14. The turbo decoder of claim 9, wherein:
  the size of the data block is defined as 994,
  the address field comprises the two most-significant bits of the received address,
  the sub-address field comprises the eight least-significant bits of the received address, and
  the plurality of memory banks includes four memory banks.

15. The turbo decoder of claim 9, wherein:
  the size of the data block is defined as 12282,
  the address field comprises the three most-significant bits of the received address,
  the sub-address field comprises the eight least-significant bits of the received address, and
  the plurality of memory banks includes six memory banks.

16. The turbo decoder of claim 9, wherein:
  the size of the data block is defined as 1146,
  the address field comprises the three most-significant bits of the received address,
  the received address further comprises a deciding address field comprising the fourth and fifth most-significant bits of the received address,
  the sub-address field comprises the five least-significant bits of the received address, and
  the combination of values of the address field and deciding address field correspond to the target memory bank in the plurality of memory banks.

17. The turbo decoder of claim 9, wherein both of the first and second memory units comprise:
  a plurality of memory banks comprising an equal number of spaces wherein a minimum number of spaces remains unoccupied when all bits in the data block occupy separate spaces in the plurality of memory banks, configured to upon a request to write into at least one of the memory banks in the plurality, store data associated with a received address, the received address comprising an address field and a sub-address field, wherein the address field contains a value corresponding to a target memory bank in the plurality of memory banks and the sub-address field contains a value corresponding to a target space within the target memory bank.

18. A method of storing data from a data block of predefined size into memory, the method comprising:
  receiving the data with a received address, the received address comprising an address field and a sub-address field;
  matching the address field value with a corresponding target memory bank in a plurality of memory banks comprising an equal number of spaces to store data associated with a received address, wherein a minimum number of spaces, which is greater than zero, remains unoccupied when all bits in the data block occupy separate spaces in the plurality of memory banks, the number of memory banks in the plurality of memory banks corresponding to the address field value of a maximum address of the data block so that a minimum number of spaces remains unoccupied when all bits in the data block occupy separate spaces in the plurality of memory banks;
  matching the sub-address field value to a corresponding target space within the target memory bank; and
  storing the data in the target space within the target memory bank;
  wherein the size of the data block is defined by one of a group of standards: MediaFLO, ETSI-SDR, or DVB-SH.

19. The method of claim 18, further comprising:
  receiving multiple requests to write to the same target memory bank simultaneously; and
  producing a stall signal in response to the simultaneous write requests.

20. The method of claim 19, further comprising:
  halting at least one of the simultaneous write requests for one clock cycle.

21. The method of claim 20, wherein a system clock is used to determine a clock cycle, the memory unit sharing the system clock with other units.

22. The method of claim 18, wherein the maximum address corresponds to the sequential address for the last bit in the data block.

* * * * *